United States Patent
Uejima et al.

(10) Patent No.: US 12,046,810 B2
(45) Date of Patent: Jul. 23, 2024

(54) RADIO-FREQUENCY MODULE AND COMMUNICATION APPARATUS

(71) Applicant: Murata Manufacturing Co., Ltd., Kyoto (JP)

(72) Inventors: Takanori Uejima, Kyoto (JP); Hiromichi Kitajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 18/176,794

(22) Filed: Mar. 1, 2023

(65) Prior Publication Data

US 2023/0208020 A1 Jun. 29, 2023

Related U.S. Application Data

(63) Continuation of application No. PCT/JP2021/032636, filed on Sep. 6, 2021.

(30) Foreign Application Priority Data

Sep. 24, 2020 (JP) .................................. 2020-160226

(51) Int. Cl.
*H01Q 1/42* (2006.01)
*H01Q 1/52* (2006.01)
*H01Q 5/40* (2015.01)

(52) U.S. Cl.
CPC ............. *H01Q 1/422* (2013.01); *H01Q 1/526* (2013.01); *H01Q 5/40* (2015.01)

(58) Field of Classification Search
None
See application file for complete search history.

(56) References Cited

U.S. PATENT DOCUMENTS

| 8,849,362 B1 | 9/2014 | Saji et al. | |
| 2012/0025356 A1 | 2/2012 | Liao et al. | |
| 2013/0043946 A1 | 2/2013 | Hadjichristos et al. | |
| 2019/0207316 A1* | 7/2019 | Mohtashami | H01Q 9/18 |
| 2021/0356550 A1* | 11/2021 | Lee | G01S 5/12 |
| 2021/0384621 A1* | 12/2021 | Johansson | H01Q 1/422 |
| 2022/0013913 A1* | 1/2022 | Ikeda | H01Q 1/48 |

(Continued)

FOREIGN PATENT DOCUMENTS

| JP | 2014-154941 A | 8/2014 |
| JP | 2014-522216 A | 8/2014 |
| JP | 2015-111803 A | 6/2015 |

OTHER PUBLICATIONS

International Search Report for PCT/JP2021/032636 dated Nov. 22, 2021.

*Primary Examiner* — Wilson Lee
(74) *Attorney, Agent, or Firm* — Pearne & Gordon LLP

(57) ABSTRACT

A radio-frequency module includes: a module substrate; a first circuit component and a second circuit component that are disposed inside the module substrate; and a metal shield plate set to a ground potential. The module substrate includes a dielectric part including a first dielectric material, and a dielectric part including a second dielectric material and located inward of the dielectric part, the second dielectric material having a relative permittivity different from that of the first dielectric material. The metal shield plate is disposed between the first circuit component and the second circuit component and in the dielectric part.

20 Claims, 5 Drawing Sheets

(56) References Cited

U.S. PATENT DOCUMENTS

| | | | |
|---|---|---|---|
| 2022/0131270 A1* | 4/2022 | Singh | H01Q 5/385 |
| 2022/0340740 A1* | 10/2022 | Spooner | B32B 5/18 |
| 2023/0006344 A1* | 1/2023 | Furuhi | H01Q 5/378 |
| 2023/0411863 A1* | 12/2023 | Takahashi | H01Q 1/422 |
| 2023/0420851 A1* | 12/2023 | Ushikoshi | H01Q 9/0421 |
| 2024/0039143 A1* | 2/2024 | Minamitani | H01Q 21/0087 |

* cited by examiner

RADIO-FREQUENCY MODULE AND COMMUNICATION APPARATUS

CROSS REFERENCE TO RELATED APPLICATION

This is a continuation of International Application No. PCT/JP2021/032636 filed on Sep. 6, 2021 which claims priority from Japanese Patent Application No. 2020-160226 filed on Sep. 24, 2020. The contents of these applications are incorporated herein by reference in their entireties.

BACKGROUND ART

Technical Field

The present disclosure relates to a radio-frequency module, and a communication apparatus.

As mobile communication apparatuses such as mobile phones are becoming, in particular, increasingly multiband, the arrangement and configuration of circuit elements constituting the radio-frequency front-end circuit of such apparatuses are becoming increasingly complex.

Patent Document 1 discloses a circuit configuration of a transceiver (transmit and receive circuit) including the following components: a plurality of transmitters (transmit paths); a plurality of receivers (receive paths); and a switchplexer (antenna switch) disposed between an antenna, and the transmitters and the receivers. Each of the transmitters includes a transmit circuit, a transmit power amplifier (PA), and an output circuit. Each of the receivers includes a receive circuit, a receive low-noise amplifier (LNA), and an input circuit. The output circuit includes components, such as a transmit filter, an impedance matching circuit, and a duplexer. The input circuit includes components, such as a receive filter, an impedance matching circuit, and a duplexer. The above-mentioned configuration allows simultaneous transmission, simultaneous reception, or simultaneous transmission and reception to be executed through the switching action of the switchplexer.

Patent Document 1: Japanese Unexamined Patent Application Publication (Translation of PCT Application) No. 2014-522216

BRIEF SUMMARY

One potential issue with implementing the transceiver (transmit and receive circuit) disclosed in Patent Document 1 by a radio-frequency module incorporated in a mobile communication apparatus would be that electromagnetic coupling may occur between at least two of circuit components disposed in each of the transmit path, the receive path, and the transmit and receive path including the antenna switch. In this case, the harmonic wave components of the transmit signal at high output power that has been amplified in the PA (transmit power amplifier) may become superposed on the transmit signal, leading to potential deterioration in the quality of the transmit signal. The electromagnetic coupling may also lead to reduced isolation between the transmit and receive sides. As a result, the harmonic waves mentioned above, or spurious waves such as intermodulation distortion between the transmit signal and another radio-frequency signal may leak into the receive path, leading to potential deterioration of reception sensitivity. The above-mentioned electromagnetic coupling may also result in interference between two receive signals, and consequently deterioration of reception sensitivity.

The present disclosure provides a radio-frequency module and a communication apparatus that allow for reduced deterioration in the quality of a transmit signal or a receive signal.

A radio-frequency module according to as aspect of the present disclosure includes: a module substrate; a first circuit component and a second circuit component that are disposed inside the module substrate; and a metal shield plate set to a ground potential. The module substrate includes a first dielectric part including a first dielectric material, and a second dielectric part including a second dielectric material and located inward of the first dielectric part, the second dielectric material having a relative permittivity different from a relative permittivity of the first dielectric material. The metal shield plate is disposed between the first circuit component and the second circuit component and in the second dielectric part.

The present disclosure makes it possible to provide a radio-frequency module and a communication apparatus that allow for reduced deterioration in the quality of a transmit signal or a receive signal.

DETAILED DESCRIPTION

Figure 1:
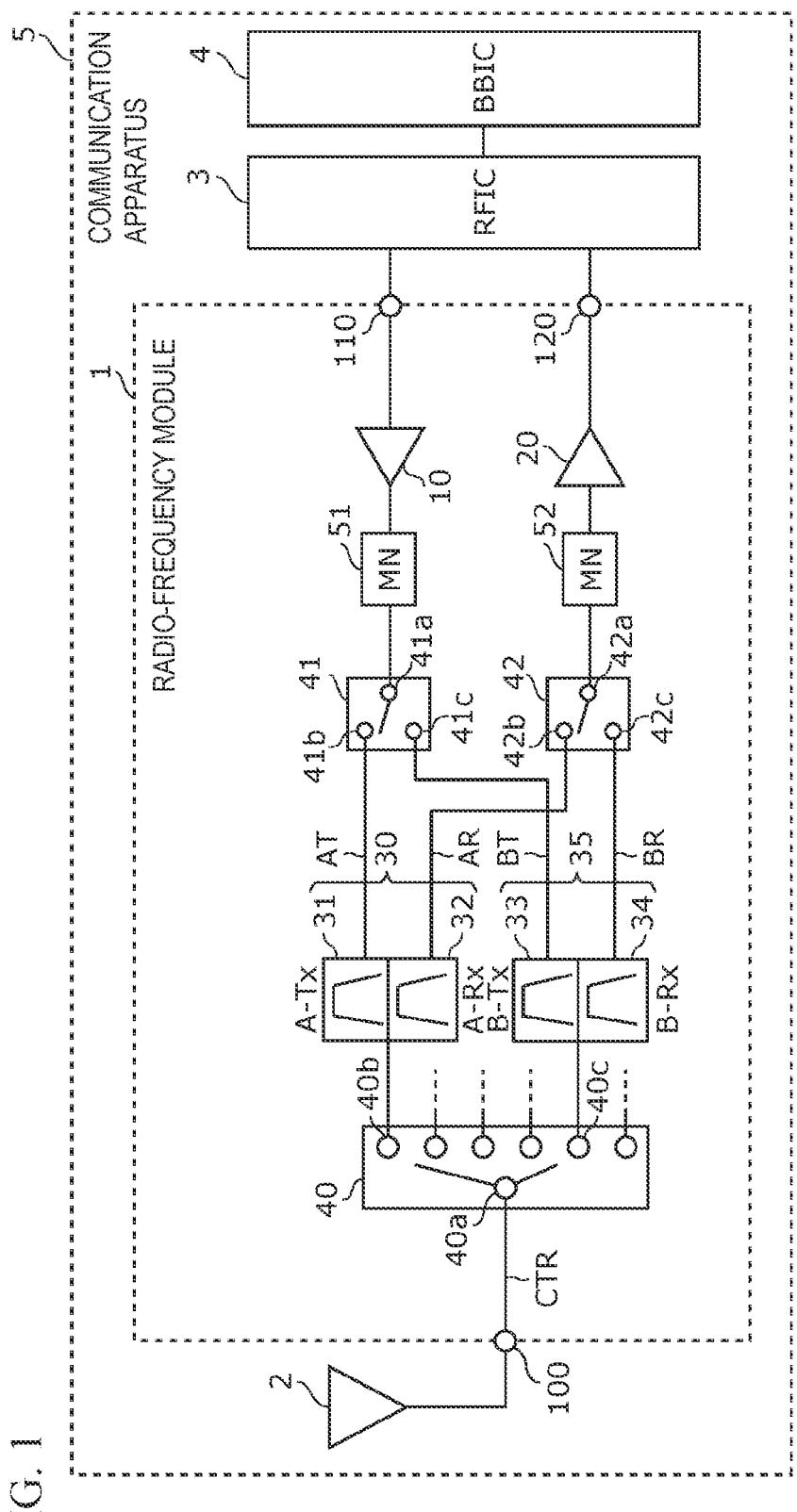
FIG. 1 illustrates the circuit configurations of a radio-frequency module and a communication apparatus according to an embodiment.

Embodiments of the present disclosure will be described below in detail. The embodiments described below represent generic or specific examples. Features presented in the following description of embodiments, inventive examples, and modifications, such as numerical values, shapes, materials, components, and the arrangement and connection of components, are illustrative only and not intended to be limiting of the present disclosure. Of the components presented in the following description of embodiments and inventive examples, those components not described in independent claims will be described as optional components. The sizes of components illustrated in the drawings or the ratios between the sizes of these components are not necessarily drawn to scale. Throughout the drawings, identical reference signs are used to designate substantially identical features, and repetitive description will be sometimes omitted or simplified.

In the following description, "parallel", "perpendicular", or other such terms indicative of the relationship between elements, "rectangular" or other such terms indicative of a shape of an element, and numerical ranges are not intended to represent only their strict meanings but are meant to also include their substantial equivalents, for example, equivalents with deviations of about a few percent.

In the figures below, an x-axis and a y-axis are mutually orthogonal axes in a plane parallel to the major face of a module substrate. A z-axis is an axis perpendicular to the major face of the module substrate. The z-axis has a positive direction defined as an upward direction, and a negative direction defined as a downward direction.

As used in the following description of the circuit configuration according to the present disclosure, the term "connected" means not only that circuit elements are directly connected with each other by a connection terminal or a wiring conductor but also that circuit elements are electrically connected with each other with another circuit element interposed therebetween. The expression "connected between A and B" means being located between A and B and connected with both A and B.

As used in the following description of the module configuration according to the present disclosure, expressions such as "in plan view" mean an orthographic projection of an object onto an xy-plane from the positive side of the z-axis. Expressions such as "a component is disposed over or in a major face of a substrate" include not only that the component is disposed on top of the major face of the substrate in contact with the major face, but also that the component is disposed above the major face without necessarily contact with the major face, and that the component is disposed with a portion thereof partially embedded into the substrate from the major face. Expressions such as "A is connected between B and C" mean that at least one of line segments connecting between a given point in B and a given point in C passes through A. Further, "parallel", "perpendicular", or other such terms indicative of the relationship between elements, and "rectangular" or other such terms indicative of a shape of an element are not intended to represent only their strict meanings but are meant to also include their substantial equivalents, for example, equivalents with deviations or differences of about a few percent.

As used in the following description, the term "transmit path" means a transfer line including, for example, wiring for transferring a radio-frequency transmit signal, an electrode directly connected with the wiring, and a terminal directly connected with the wiring or the electrode. The term "receive path" means a transfer line including, for example, wiring for transferring a radio-frequency receive signal, an electrode directly connected with the wiring, and a terminal directly connected with the wiring or the electrode. The term "transmit and receive path" means a transfer line including, for example, wiring for transferring a radio-frequency transmit signal and a radio-frequency receive signal, an electrode directly connected with the wiring, and a terminal directly connected with the wiring or the electrode.

Embodiment

[1. Circuit Configurations of Radio-Frequency Module 1 and Communication Apparatus 5]

FIG. 1 illustrates the circuit configurations of a radio-frequency module 1 and a communication apparatus 5 according to an embodiment. As illustrated in FIG. 1, the communication apparatus 5 includes the radio-frequency module 1, an antenna 2, a radio-frequency integrated circuit (RFIC) 3, and a baseband integrated circuit (BBIC) 4.

The RFIC 3 represents a circuit that processes radio-frequency signals transmitted and received by the antenna 2. Specifically, the RFIC 3 applies signal processing such as down-conversion to a radio-frequency receive signal input via a receive signal path of the radio-frequency module 1, and outputs the processed receive signal to the BBIC 4. The RFIC 3 also applies signal processing such as up-conversion to a transmit signal input from the BBIC 4, and outputs the processed radio-frequency transmit signal to a transmit signal path of the radio-frequency module 1.

The BBIC 4 is a circuit that processes a signal by using a band of intermediate frequencies lower than the frequencies of radio-frequency signals that propagate in the radio-frequency module 1. The signal processed by the BBIC 4 is used as, for example, a video signal for image display, or as an audio signal for telephone conversation using a speaker.

The RFIC 3 also serves as a controller that, based on the communication band (frequency band) to be used, controls the connections of switches 40, 41 and 42 included in the radio-frequency module 1. Specifically, the RFIC 3 switches the connections of the switches 40 to 42 of the radio-frequency module 1 by a control signal (not illustrated). The controller may be provided outside the RFIC 3, for example, in the radio-frequency module 1 or the BBIC 4.

The antenna 2 is connected with an antenna connection terminal 100 of the radio-frequency module 1. The antenna 2 radiates a radio-frequency signal output from the radio-frequency module 1. The antenna 2 also receives an extraneous radio-frequency signal, and outputs the received radio-frequency signal to the radio-frequency module 1.

The communication apparatus 5 according to the embodiment is not necessarily required to include the antenna 2 and the BBIC 4.

Reference is now made to a detailed configuration of the radio-frequency module 1.

As illustrated in FIG. 1, the radio-frequency module 1 includes the following components: a power amplifier 10, a low-noise amplifier 20, transmit filters 31 and 33, receive filters 32 and 34, matching circuits 51 and 52, the switches 40, 41, and 42, the antenna connection terminal 100, a transmit input terminal 110, and a receive output terminal 120.

The antenna connection terminal 100 is connected with the antenna 2. The transmit input terminal 110 is a terminal for receiving a transmit signal from a source (RFIC 3) external to the radio-frequency module 1. The receive output terminal 120 is a terminal for supplying a receive signal to a destination (RFIC 3) external to the radio-frequency module 1.

The power amplifier 10 is a transmit amplifier that amplifies transmit signals that are in a communication band A and a communication band B. The power amplifier 10 has an input terminal that is connected with the transmit input terminal 110, and an output terminal that is connected with the matching circuit 51.

The low-noise amplifier 20 is a receive amplifier that provides low-noise amplification of receive signals that are in the communication band A and the communication band B. The low-noise amplifier 20 has an input terminal that is connected with the matching circuit 52, and an output terminal that is connected with the receive output terminal 120.

The transmit filter 31 is disposed in a transmit path AT that connects the power amplifier 10 with the switch 40. The transmit filter 31 is capable of passing, from among transmit signals amplified in the power amplifier 10, a transmit signal in a transmit band that coincides with the communication band A. The transmit filter 33 is disposed in a transmit path BT that connects the power amplifier 10 with the switch 40. The transmit filter 33 is capable of passing, from among transmit signals amplified in the power amplifier 10, a transmit signal in a transmit band that coincides with the communication band B.

The receive filter 32 is disposed in a receive path AR that connects the low-noise amplifier 20 with the switch 40. The receive filter 32 is capable of passing, from among receive signals input from the antenna connection terminal 100, a receive signal in a receive band that coincides with the communication band A. The receive filter 34 is disposed in a receive path BR that connects the low-noise amplifier 20 with the switch 40. The receive filter 34 is capable of passing, from among receive signals input from the antenna connection terminal 100, a receive signal in a receive band that coincides with the communication band B.

Non-limiting suitable examples of the transmit filters 31 and 33 and the receive filters 32 and 34 may include: surface acoustic wave filters; acoustic wave filters employing bulk acoustic waves (BAWs); LC resonant filters; and dielectric filters.

The transmit filter 31 and the receive filter 32 constitute a duplexer 30 with a pass band that coincides with the communication band A. The transmit filter 33 and the receive filter 34 constitute a duplexer 35 with a pass band that coincides with the communication band B.

Each of the duplexers 30 and 35 may be a single filter that transfers data by use of the time division duplex (TDD) method. In this case, a switch for switching between transmission and reception is disposed in at least one of the following locations: the location preceding the single filter; and the location subsequent to the single filter.

The matching circuit 51 is disposed between the power amplifier 10 and the switch 41. The matching circuit 51 performs impedance matching between the power amplifier 10 and the transmit filter 31. The matching circuit 51 includes at least one inductor. The matching circuit 51 may be disposed in series with the transmit path AT, or may be connected between the transmit path AT and ground.

The matching circuit 52 is disposed between the low-noise amplifier 20 and the switch 42. The matching circuit 52 performs impedance matching between the low-noise amplifier 20 and the receive filter 32. The matching circuit 52 includes at least one inductor. The matching circuit 52 may be disposed in series with the receive path AR, or may be connected between the receive path AR and ground.

Instead of the matching circuit 51, a matching circuit may be disposed in each of the transmit path AT between the transmit filter 31 and the switch 41, and the transmit path BT between the transmit filter 33 and the switch 41.

Instead of the matching circuit 52, a matching circuit may be disposed in each of the receive path AR between the receive filter 32 and the switch 42, and the receive path BR between the receive filter 34 and the switch 42.

A matching circuit may be disposed between the antenna connection terminal 100 and the switch 40.

The switch 40 includes a common terminal 40a, and selection terminals 40b and 40c. The common terminal 40a is connected with the antenna connection terminal 100. The selection terminal 40b is connected with the duplexer 30, and the selection terminal 40c is connected with the duplexer 35. That is, the switch 40 is an antenna switch disposed between the antenna connection terminal 100 and each of the duplexers 30 and 35. The switch 40 serves to: (1) switch whether to connect the antenna connection terminal 100 with the duplexer 30; and (2) whether to connect the antenna connection terminal 100 with the duplexer 35. The switch 40 is implemented as a multi-connection switching circuit capable of simultaneously establishing the connections mentioned in the items (1) and (2) above.

The switch 41 includes a common terminal 41a, and selection terminals 41b and 41c. The switch 41 is disposed in the transmit path that connects the power amplifier 10 with each of the transmit filters 31 and 33. The switch 41 switches whether to connect the power amplifier 10 with the transmit filter 31, and whether to connect the power amplifier 10 with the transmit filter 33. The switch 41 is implemented as, for example, a single-pole double-throw (SPDT) switching circuit. The common terminal 41a of the switch 41 is connected with the output terminal of the power amplifier 10 with the matching circuit 51 interposed therebetween, the selection terminal 41b is connected with the transmit filter 31, and the selection terminal 41c is connected with the transmit filter 33.

The switch 42 includes a common terminal 42a, and selection terminals 42b and 42c. The switch 42 is disposed in the receive path that connects the low-noise amplifier 20 with each of the receive filters 32 and 34. The switch 42 switches whether to connect the low-noise amplifier 20 with the receive filter 32, and whether to connect the low-noise amplifier 20 with the receive filter 34. The switch 42 is implemented as, for example, a single-pole double-throw (SPDT) switching circuit. The common terminal 42a of the switch 42 is connected with the input terminal of the low-noise amplifier 20 with the matching circuit 52 interposed therebetween, the selection terminal 42b is connected with the receive filter 32, and the selection terminal 42c is connected with the receive filter 34.

The transmit path AT is a signal path to transfer a transmit signal in the communication band A, and to connect the transmit input terminal 110 with the common terminal 40a. The transmit path BT is a signal path to transfer a transmit signal in the communication band B, and to connect the transmit input terminal 110 with the common terminal 40a. The receive path AR is a signal path to transfer a receive signal in the communication band A, and to connect the receive output terminal 120 with the common terminal 40a. The receive path BR is a signal path to transfer a receive signal in the communication band B, and to connect the receive output terminal 120 with the common terminal 40a. A transmit and receive path CTR is a signal path to transfer a transmit signal and a receive signal that are in the communication band A, to transfer a transmit signal and a receive signal that are in the communication band B, and to connect the antenna connection terminal 100 with the common terminal 40a.

In the radio-frequency module 1 with the circuit configuration mentioned above, the power amplifier 10, the matching circuit 51, the switch 41, and the transmit filter 31 constitute a first transmit circuit that outputs a transmit signal in the communication band A toward the antenna connection terminal 100. The power amplifier 10, the matching circuit 51, the switch 41, and the transmit filter 33 constitute a second transmit circuit that outputs a transmit signal in the communication band B toward the antenna connection terminal 100.

The low-noise amplifier 20, the matching circuit 52, the switch 42, and the receive filter 32 constitute a first receive circuit that receives a receive signal in the communication band A from the antenna 2 via the antenna connection terminal 100. The low-noise amplifier 20, the matching circuit 52, the switch 42, and the receive filter 34 constitute a second receive circuit that receives a receive signal in the communication band B from the antenna 2 via the antenna connection terminal 100.

The circuit configuration mentioned above allows the radio-frequency module 1 according to the embodiment to execute at least one of the following operations: (1) transmission and reception of a radio-frequency signal in the communication band A; (2) transmission and reception of a radio-frequency signal in the communication band B; and (3) simultaneous transmission, simultaneous reception, or simultaneous transmission and reception of a radio-frequency signal in the communication band A and a radio-frequency signal in the communication band B.

In the radio-frequency module according to the present disclosure, each of the transmit circuit and the receive circuit does not have to be connected with the antenna connection terminal 100 with the switch 40 interposed therebetween. Alternatively, each of the transmit circuit and the receive circuit may be connected with the antenna 2 with a different terminal interposed therebetween. As for the circuit configuration of the radio-frequency module according to the present disclosure, the radio-frequency module may simply include at least two of a transmit path, a receive path, and a transmit and receive path, and one or more circuit components disposed in each of the two paths. The radio-frequency module may simply include one of the first transmit circuit and the second transmit circuit. The radio-frequency module may simply include one of the first receive circuit and the second receive circuit.

One potential issue with the radio-frequency module 1 having the circuit configuration mentioned above is that if electromagnetic coupling occurs between at least two of circuit components disposed in each of the transmit path, the receive path, and the transmit and receive path, harmonic wave components of the transmit signal at high output power that has been amplified in the power amplifier may become superposed on the transmit signal, leading to deterioration in the quality of the transmit signal. Another potential issue is that the above-mentioned electromagnetic coupling may result in reduced isolation between the transmit and receive sides. As a result, the above-mentioned harmonic waves, or spurious waves such as intermodulation distortion between the transmit signal and another radio-frequency signal may leak into the receive path, leading to deterioration of reception sensitivity. Another potential issue is that the above-mentioned electromagnetic coupling may result in interference between two receive signals, which may lead to deterioration of reception sensitivity.

To address these issues, the radio-frequency module 1 according to the embodiment is designed to have a configuration to reduce the above-mentioned electromagnetic coupling. Reference is now made to how the radio-frequency module 1 according to the embodiment is configured to reduce the above-mentioned electromagnetic coupling. [2. Arrangement of Circuit Components of Radio-Frequency Module 1A according to Inventive Example]

Figure 2A:
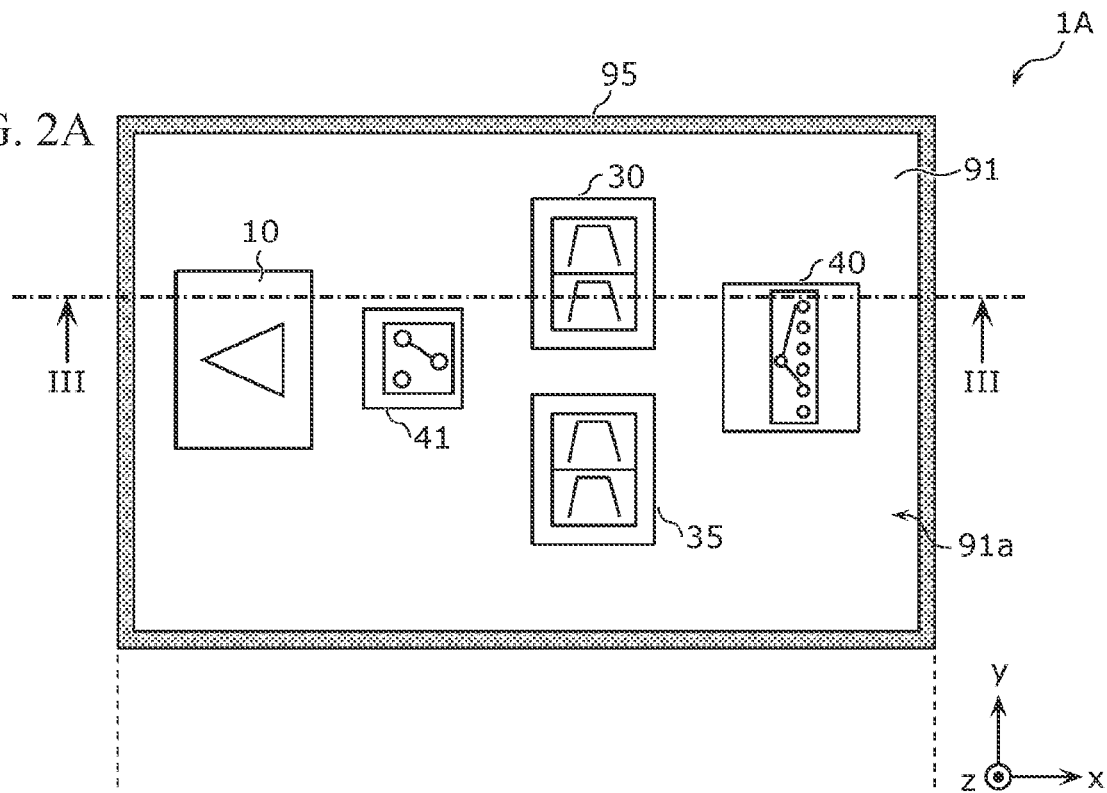
FIGS. 2A and 2B are plan views of a radio-frequency module according to an inventive example.
Figure 2B:
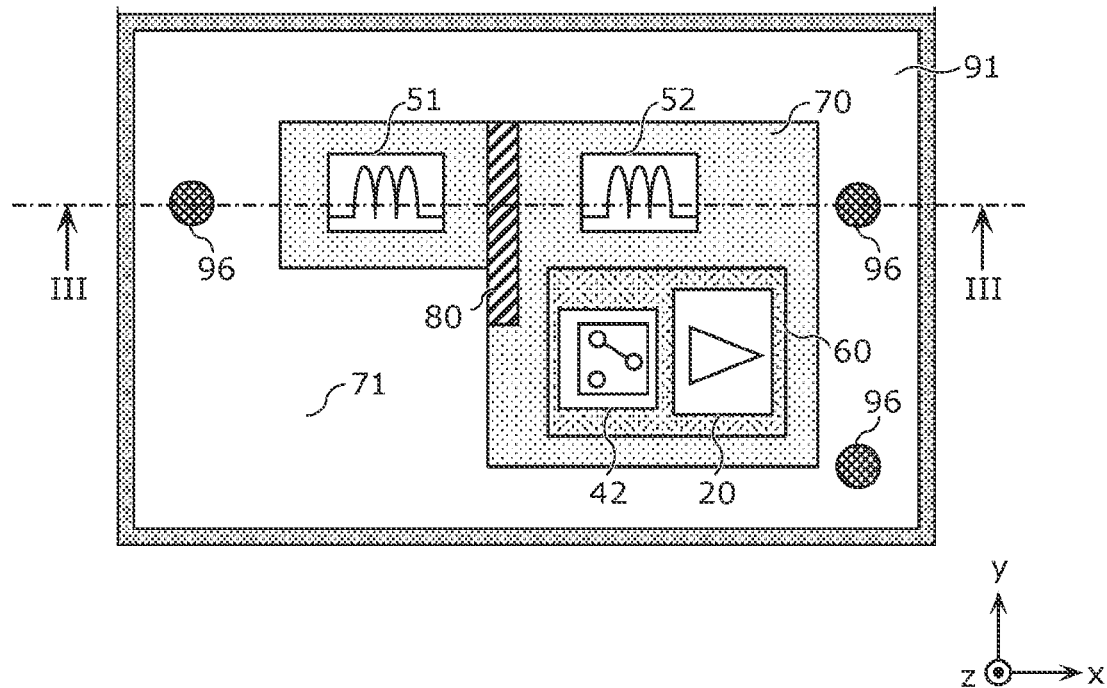
Figure 3:
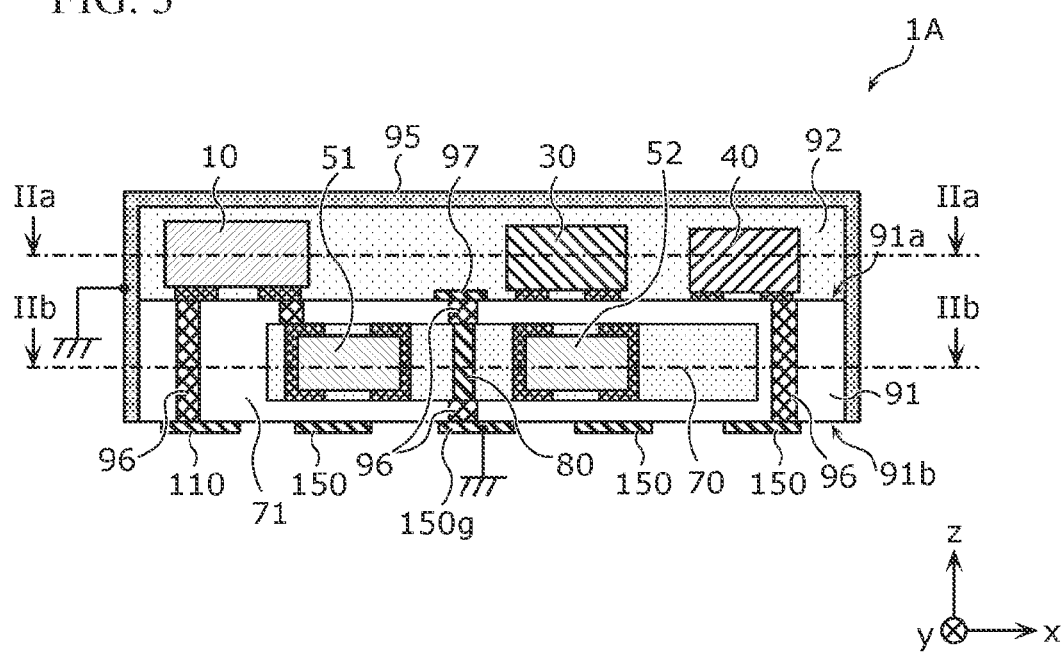
FIG. 3 is a cross-sectional view of the radio-frequency module according to the inventive example.

FIGS. 2A and 2B are schematic plan views of a radio-frequency module 1A according to an inventive example. FIG. 3 is a schematic cross-sectional view of the radio-frequency module 1A according to the inventive example. Specifically, FIG. 3 illustrates a cross-section taken along a line III-III in FIGS. 2A and 2B. FIG. 2A illustrates an arrangement of circuit elements with a cutting plane viewed from the positive side in the direction of the z-axis, the cutting plane passing through a line IIa-IIa in FIG. 3 and being parallel to a major face 91a. FIG. 2B illustrates an arrangement of circuit elements with a cutting plane viewed from the positive side in the direction of the z-axis, the cutting plane passing through a line IIb-IIb in FIG. 3 and being parallel to the major face 91a.

The radio-frequency module 1A according to the inventive example represents a specific arrangement of circuit components of the radio-frequency module 1 according to the embodiment.

As illustrated in FIGS. 2A and 2B, the radio-frequency module 1A according to the inventive example further includes the following components in addition to the circuit components illustrated in FIG. 1: a module substrate 91, a metal shield plate 80, a metal shield layer 95, a resin component 92, external connection terminals 150, and a via-conductor 96.

The module substrate 91 is a substrate with major faces 91a and 91b on which the first and second transmit circuits and the first and second receive circuits can be mounted. Non-limiting examples of the module substrate 91 include the following substrates with a multilayer structure of a plurality of dielectric layers; low temperature co-fired ceramic (LTCC) substrates; high temperature co-fired ceramic (HTCC) substrates; substrates with embedded components; substrates with a redistribution layer (RDL); and printed circuit boards. The antenna connection terminal 100, the transmit input terminal 110, and the receive output terminal 120 may be provided over the module substrate 91.

As illustrated in FIGS. 2A, 2B, and 3, the module substrate 91 includes a dielectric part 71 (first dielectric part), and a dielectric part 70. The dielectric part 71 includes a first dielectric material. The dielectric part 70 includes a second dielectric material with a relative permittivity different from that of the first dielectric material. The dielectric part 70 is located inward of the dielectric part 71.

The dielectric part 71 includes the first dielectric material as its main component, and the dielectric part 70 includes the second dielectric material as its main component. As used herein, expressions such as "A includes B as its main component" mean that B accounts for 50 percent by weight or more of all components of A.

The metal shield plate 80 is a metal wall disposed in the dielectric part 70 and extending perpendicularly in the direction of the z-axis. The metal shield plate 80 is set to a ground potential. Specifically, the metal shield plate 80 is connected at the upper and lower ends with the via-conductor 96 disposed in the dielectric part 71. The via-conductor 96 that is connected with the lower end of the metal shield plate 80 is connected with a ground terminal 150g. The via-conductor 96 that is connected with the upper end of the metal shield plate 80 is connected with a ground electrode 97 disposed over the major face 91a. A detailed structure of the metal shield plate 80 will be described later with reference to FIGS. 4A to 4F.

The matching circuit 51 represents an example of a first circuit component, and is disposed inside the module substrate 91. The matching circuit 52 represents an example of a second circuit component, and is disposed inside the module substrate 91. The matching circuit 51 includes a first inductor connected with the output terminal of the power amplifier 10. The matching circuit 52 includes a second inductor connected with the input terminal of the low-noise amplifier 20.

The metal shield plate 80 is disposed between the first circuit component and the second circuit component and in the dielectric part 70.

According to the above-mentioned configuration, the metal shield plate 80 is connected with the ground potential inside the module substrate 91. This allows for enhanced electromagnetic shielding function inside the module substrate 91. Due to the metal shield plate 80 being in plate form, it is difficult to place the metal shield plate 80 inside the module substrate 91 simultaneously with the forming of the module substrate 91. In this regard, the dielectric part 70, which is a part in which the metal shield plate 80 is to be disposed, is made of a dielectric material that differs in relative permittivity from the dielectric material of the dielectric part 71, which is located outward of the dielectric part 70. This means that the step of placing the metal shield plate 80 in the dielectric part 70, and the step of forming the module substrate 91 including the dielectric part 71 can be made separate. This allows for easy placement of the metal shield plate 80 inside the module substrate 91. As described above, the metal shield plate 80 is disposed between the first circuit component and the second circuit component that are disposed inside the module substrate 91. This helps to reduce electromagnetic coupling between the first circuit component and the second circuit component. This results in the ability to reduce strong signal interference inside the module substrate 91 between transmit signals, between a transmit signal and a receive signal, and between receive signals. This in turn helps to reduce deterioration in the quality of a transmit signal and a receive signal.

Desirably, the second dielectric material constituting the dielectric part 70 has a relative permittivity lower than the relative permittivity of the first dielectric material constituting the dielectric part 71.

According to the above-mentioned configuration, interference between radio-frequency signals in the dielectric part 70 can be reduced in comparison to interference between radio-frequency signals in the dielectric part 71.

Further, it is desirable that the dielectric part 70 be a cavity.

The above-mentioned configuration helps to minimize interference between radio-frequency signals in the dielectric part 70, and also simplify the step of forming the dielectric part 70.

The first circuit component and the second circuit component, which are to be disposed inside the module substrate 91, may be made of a conductor pattern provided in the dielectric part 71.

The above-mentioned configuration allows for miniaturization of the radio-frequency module 1A.

At least one of the first circuit component and the second circuit component that are disposed inside the module substrate 91 may be a surface-mount electronic component or a surface-mount semiconductor IC.

According to the above-mentioned configuration, an electronic component with a high Q-factor, or a high-performance semiconductor IC is disposed inside the module substrate. This enables miniaturization while allowing for improved radio-frequency performance of the radio-frequency module 1A.

The first circuit component and the second circuit component may be disposed in the dielectric part 70.

According to the above-mentioned configuration, the step of placing the first circuit component, the second circuit component, and the metal shield plate 80 in the dielectric part 70, and the step of forming the module substrate 91 can be made separate. This therefore allows a surface-mount electronic component and a surface-mount semiconductor IC to be easily placed inside the module substrate 91 together with the metal shield plate 80.

The resin component 92 is disposed over the major face 91a of the module substrate 91. The resin component 92 covers at least part of circuit components constituting the first and second transmit circuits, at least part of circuit components constituting the first and second receive circuits, and the major face 91a of the module substrate 91. The resin component 92 serves to ensure the reliability of the above-mentioned circuit components, such as mechanical strength and moisture resistance. The radio-frequency module according to the present disclosure is not necessarily required to include the resin component 92.

The external connection terminals 150 are disposed over the major face 91b of the module substrate 91. The radio-frequency module 1A exchanges electrical signals through the external connection terminals 150 with an external substrate that is located on the negative side in the direction of the z-axis relative to the radio-frequency module 1A. Among the external connection terminals 150, the ground terminal 150g is set to the ground potential of the external substrate. The external connection terminals 150 may be flat electrodes disposed over the major face 91b as illustrated in FIGS. 2A and 2B, or may be bump electrodes disposed over the major face 91b.

The metal shield layer 95 covers the surface of the resin component 92, and is set to the ground potential. The metal shield layer 95 is, for example, a metallic thin film formed by sputtering.

The metal shield plate 80 may be connected with the metal shield layer 95 via the via-conductor 96 and a ground conductor that is disposed in the dielectric part 71. This helps to further enhance the electromagnetic shielding function of the metal shield plate 80.

In the radio-frequency module 1A according to the inventive example, the power amplifier 10, the switches 40 and 41, and the duplexers 30 and 35 are disposed over the major face 91a. The matching circuits 51 and 52, the low-noise amplifier 20, and the switch 42 are disposed inside the module substrate 91. The circuit components disposed over the major face 91a are connected via the via-conductor 96 with the first circuit component and the second circuit component that are disposed inside the module substrate, and also connected via the via-conductor 96 with the external connection terminals 150 disposed over the major face 91b.

Although not illustrated in FIGS. 2A and 2B, pieces of wiring constituting the transmit paths AT and BT and the receive paths AR and BR, which are illustrated in FIG. 1, are disposed inside the module substrate 91 and over the major faces 91a and 91b. Each piece of wiring may be a bonding wire that is joined at opposite ends to the major face 91a or 91b and one of circuit components constituting the radio-frequency module 1A, or may be a terminal, an electrode, or a piece of wiring that is disposed over or in the surface of a circuit component constituting the radio-frequency module 1A.

The low-noise amplifier 20 is included in a semiconductor IC 60 (first semiconductor IC) together with the switch 42. This helps to reduce the profile of the radio-frequency module 1A, and reduce the area required inside the module substrate 91 for mounting components. The semiconductor IC 60 may include no switch 42. The semiconductor IC 60 may include at least one of the switches 40 and 41.

According to the above-mentioned configuration, the low-noise amplifier 20 represents an example of a second circuit component, and is disposed inside the module substrate 91. In this regard, the metal shield plate 80 is disposed between the first inductor of the matching circuit 51, and the semiconductor IC 60.

According to the above-mentioned configuration, the presence of the metal shield plate 80 allows for reduced electromagnetic coupling between a transmit signal to be transferred through the first inductor, and a receive signal to be transferred through the low-noise amplifier 20. This therefore helps to reduce strong signal interference between a transmit signal and a receive signal inside the module substrate 91, and consequently reduce deterioration of reception sensitivity.

The first circuit component and the second circuit component that are disposed inside the module substrate 91 may each be any one of the following components constituting the radio-frequency module 1A: the power amplifier 10, the switches 40 to 42, the duplexers 30 and 35, the matching circuits 51 and 52, and the low-noise amplifier 20. The first circuit component and the second circuit component that are disposed inside the module substrate 91 may respectively be a component disposed in the transmit path AT, and a component disposed in the receive path AR. This helps to reduce strong signal interference between a transmit signal and a receive signal inside the module substrate 91, and consequently reduce deterioration of reception sensitivity.

The first circuit component and the second circuit component that are disposed inside the module substrate 91 may respectively be a component disposed in the transmit path AT, and a component disposed in the transmit and receive path. If electromagnetic coupling occurs between the first circuit component disposed in the transmit path AT, and the second circuit component disposed in the transmit and receive path, this may, in some cases, result in harmonic wave components amplified by the power amplifier 10 being transmitted from the antenna 2, leading to potential deterioration in the quality of a transmit signal. Reducing such electromagnetic coupling by the metal shield plate 80 helps to reduce such deterioration in the quality of a transmit signal.

The first circuit component and the second circuit component that are disposed inside the module substrate 91 may respectively be a component disposed in the receive path AR, and a component disposed in the transmit and receive path. If electromagnetic coupling occurs between the first circuit component disposed in the receive path AR, and the second circuit component disposed in the transmit and receive path, a transmit signal at high output power amplified by the power amplifier 10, and its harmonic wave components may leak into the receive path AR, leading to potential deterioration of reception sensitivity. Reducing such electromagnetic coupling by the metal shield plate 80 helps to improve isolation between the transmit and receive sides, and consequently reduce deterioration of reception sensitivity.

[3. Structure of Metal Shield Plate]

Reference is now made to the structure of the metal shield plate 80 included in the radio-frequency module 1A according to the inventive example.

Figure 4A:
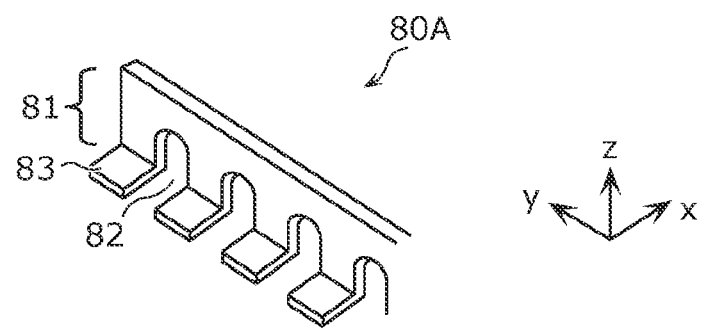
FIG. 4A is a perspective exterior view of a first example of a metal shield plate.

FIG. 4A is a perspective exterior view of a metal shield plate 80A. The metal shield plate 80A illustrated in FIG. 4A is an example of the metal shield plate 80 according to the inventive example. The metal shield plate 80A is disposed in the dielectric part 70, and extends perpendicularly in the direction of the z-axis. A hole 82 is provided between the metal shield plate 80A and the dielectric part 71. The hole 82 penetrates the metal shield plate 80A in the direction of the normal to the metal shield plate 80A (i.e., in the direction of the x-axis).

The metal shield plate 80A includes a body part 81, and a joint part 83. The body part 81 is disposed in the dielectric part 70, and extends perpendicularly in the direction of the z-axis. The joint part 83 extends in parallel to the major face 91a, and is joined with the via-conductor 96 disposed in the dielectric part 71.

With the structure of the metal shield plate 80A mentioned above, the presence of the hole 82 between the body part 81 and the dielectric part 71 helps to ensure, in forming the dielectric part 70, good flowability of the second dielectric material in liquid form in the vicinity of the metal shield plate 80A. This in turn helps to reduce occurrence, in the vicinity of the metal shield plate 80A, of voids or other areas where no second dielectric material is present. Further, as described above, the metal shield plate 80A and the via-conductor 96 are joined with each other by the joint part 83. This improves the accuracy of placement of the metal shield plate 80A, and the strength of the joining between the metal shield plate 80A and the via-conductor 96.

Figure 4B:
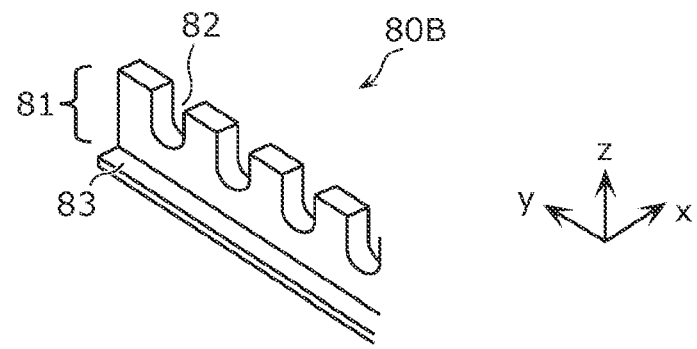
FIG. 4B is a perspective exterior view of a second example of the metal shield plate.

FIG. 4B is a perspective exterior view of a metal shield plate 80B. The metal shield plate 80B illustrated in FIG. 4B is an example of the metal shield plate 80 according to the inventive example. The metal shield plate 80B is disposed in the dielectric part 70, and extends perpendicularly in the direction of the z-axis. A hole 82 is provided between the metal shield plate 80B and the dielectric part 71. The hole 82 penetrates the metal shield plate 80B in the direction of the normal to the metal shield plate 80B (i.e., in the direction of the x-axis).

The metal shield plate 80B includes a body part 81, and a joint part 83. The body part 81 is disposed in the dielectric part 70, and extends perpendicularly in the direction of the z-axis. The joint part 83 extends in parallel to the major face 91a, and is joined with the via-conductor 96 disposed in the dielectric part 71.

With the structure of the metal shield plate 80B mentioned above, the presence of the hole 82 between the body part 81 and the dielectric part 71 helps to ensure, in forming the dielectric part 70, good flowability of the second dielectric material in liquid form in the vicinity of the metal shield plate 80B. This in turn helps to reduce occurrence, in the vicinity of the metal shield plate 80B, of voids or other areas where no second dielectric material is present. Further, as described above, the metal shield plate 80B and the via-conductor 96 are joined with each other by the joint part 83. This improves the accuracy of placement of the metal shield plate 80B, and the strength of the joining between the metal shield plate 80B and the via-conductor 96.

Figure 4C:
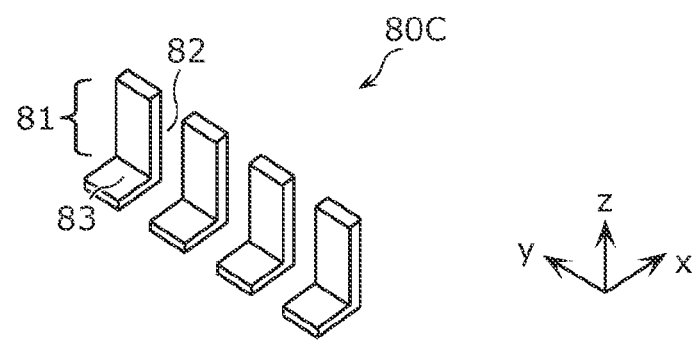
FIG. 4C is a perspective exterior view of a third example of the metal shield plate.

FIG. 4C is a perspective exterior view of a metal shield plate 80C. The metal shield plate 80C illustrated in FIG. 4C is an example of the metal shield plate 80 according to the inventive example. The metal shield plate 80C is disposed in the dielectric part 70, and extends perpendicularly in the direction of the z-axis. A hole 82 is provided between the upper and lower faces of the dielectric part 70. The hole 82 penetrates the metal shield plate 80C in the direction of the normal to the metal shield plate 80C (i.e., in the direction of the x-axis).

The metal shield plate 80C includes a plurality of body parts 81, and a plurality of joint parts 83. The body parts 81 are disposed in the dielectric part 70, and extend perpendicularly in the direction of the z-axis. The joint parts 83 extend in parallel to the major face 91a, and are joined with the via-conductor 96 disposed in the dielectric part 71. In the metal shield plate 80C, the body parts 81 are disposed discretely with the hole 82 interposed between adjacent body parts 81, and the joint parts 83 are disposed discretely with the hole 82 interposed between adjacent joint parts 83.

With the structure of the metal shield plate 80C mentioned above, the presence of the hole 82 between the body parts 81 helps to ensure, in forming the dielectric part 70, good flowability of the second dielectric material in liquid form in the vicinity of the metal shield plate 80C. This in turn helps to reduce occurrence, in the vicinity of the metal shield plate 80C, of voids or other areas where no second dielectric material is present. Further, as described above, the metal shield plate 80C and the via-conductor 96 are joined with each other by the joint parts 83. This improves the accuracy of placement of the metal shield plate 80C, and the strength of the joining between the metal shield plate 80C and the via-conductor 96.

Figure 4D:
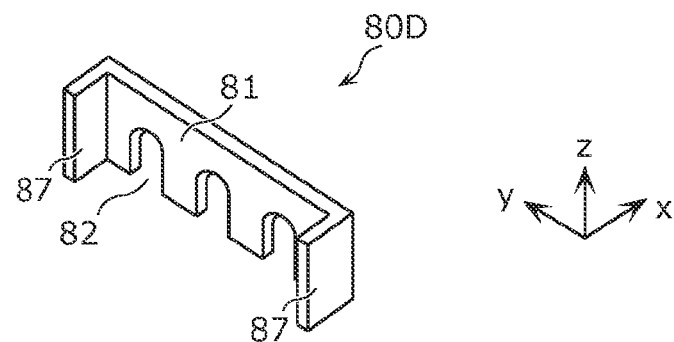
FIG. 4D is a perspective exterior view of a fourth example of the metal shield plate.

FIG. 4D is a perspective exterior view of a metal shield plate 80D. The metal shield plate 80D illustrated in FIG. 4D is an example of the metal shield plate 80 according to the inventive example. The metal shield plate 80D is disposed in the dielectric part 70, and extends perpendicularly in the direction of the z-axis. A hole 82 is provided between the upper and lower faces of the dielectric part 70. The hole 82 penetrates the metal shield plate 80D in the direction of the normal to the metal shield plate 80D (i.e., in the direction of the x-axis).

The metal shield plate 80D includes a body part 81, and a body end portion 87 with a flat shape. The body part 81 is disposed in the dielectric part 70, and extends perpendicularly in the direction of the z-axis. The body end portion 87 is disposed at an end portion of the body part 81 that is located in a direction parallel to the major face 91a. The body end portion 87 extends perpendicularly from the upper face of the dielectric part 70 toward the lower face (i.e., in the direction of the z-axis). The body part 81 and the body end portion 87 are non-parallel to each other.

With the structure of the metal shield plate 80D mentioned above, the presence of the hole 82 between the body parts 81 helps to ensure, in forming the dielectric part 70, good flowability of the second dielectric material in liquid form in the vicinity of the metal shield plate 80D. This in turn helps to reduce occurrence, in the vicinity of the metal shield plate 80D, of voids or other areas where no second dielectric material is present. As described above, the body part 81 and the body end portion 87 are non-parallel to each other. This helps to ensure that the metal shield plate 80D be self-standing. The absence of the joint part 83, which is included in the metal shield plates 80A to 80C, helps to reduce the space required for the placement of the metal shield plate 80D.

Figure 4E:
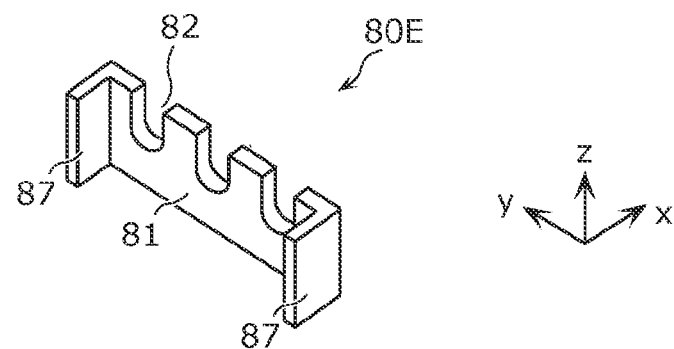
FIG. 4E is a perspective exterior view of a fifth example of the metal shield plate.

FIG. 4E is a perspective exterior view of a metal shield plate 80E. The metal shield plate 80E illustrated in FIG. 4E is an example of the metal shield plate 80 according to the inventive example. The metal shield plate 80E is disposed in the dielectric part 70, and extends perpendicularly in the direction of the z-axis. A hole 82 is provided between the upper and lower faces of the dielectric part 70. The hole 82 penetrates the metal shield plate 80E in the direction of the normal to the metal shield plate 80E (i.e., in the direction of the x-axis).

The metal shield plate 80E includes a body part 81, and a body end portion 87 with a flat shape. The body part 81 is disposed in the dielectric part 70, and extends perpendicularly in the direction of the z-axis. The body end portion 87 is disposed at an end portion of the body part 81 that is located in a direction parallel to the major face 91a. The body end portion 87 extends perpendicularly from the upper face of the dielectric part 70 toward the lower face (i.e., in the direction of the z-axis). The body part 81 and the body end portion 87 are non-parallel to each other.

With the structure of the metal shield plate 80E mentioned above, the presence of the hole 82 between the body parts 81 helps to ensure, in forming the dielectric part 70, good flowability of the second dielectric material in liquid form in the vicinity of the metal shield plate 80E. This in turn helps to reduce occurrence, in the vicinity of the metal shield plate 80E, of voids or other areas where no second dielectric material is present. As described above, the body part 81 and the body end portion 87 are non-parallel to each other. This helps to ensure that the metal shield plate 80E be self-standing. The absence of the joint part 83, which is included in the metal shield plates 80A to 80C, helps to reduce the space required for the placement of the metal shield plate 80E.

Figure 4F:
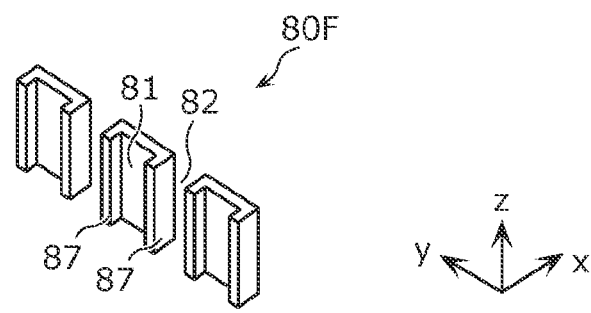
FIG. 4F is a perspective exterior view of a sixth example of the metal shield plate.

FIG. 4F is a perspective exterior view of a metal shield plate 80F. The metal shield plate 80F illustrated in FIG. 4F is an example of the metal shield plate 80 according to the inventive example. The metal shield plate 80F is disposed in the dielectric part 70, and extends perpendicularly in the direction of the z-axis. A hole 82 is provided between the upper and lower faces of the dielectric part 70. The hole 82 penetrates the metal shield plate 80F in the direction of the normal to the metal shield plate 80F (i.e., in the direction of the x-axis).

The metal shield plate 80F includes a plurality of body parts 81, and a body end portion 87 with a flat shape. The body parts 81 are disposed in the dielectric part 70, and extend perpendicularly in the direction of the z-axis. The body end portion 87 is disposed at an end portion of each body part 81 that is located in a direction parallel to the major face 91a. The body end portion 87 extends perpendicularly from the upper face of the dielectric part 70 toward the lower face (i.e., in the direction of the z-axis). Each body part 81 and the body end portion 87 are non-parallel to each other.

With the structure of the metal shield plate 80F mentioned above, the presence of the hole 82 between the body parts 81 helps to ensure, in forming the dielectric part 70, good flowability of the second dielectric material in liquid form in the vicinity of the metal shield plate 80F. This in turn helps to reduce occurrence, in the vicinity of the metal shield plate 80F, of voids or other areas where no second dielectric material is present. As described above, each body part 81 and the body end portion 87 are non-parallel to each other. This helps to ensure that the metal shield plate 80F be self-standing. The absence of the joint part 83, which is included in the metal shield plates 80A to 80C, helps to reduce the space required for the placement of the metal shield plate 80F.

Exemplary configurations of the metal shield plate 80 are not limited to those of the metal shield plates 80A to 80F mentioned above. For example, the metal shield plate 80 may have a plurality of holes 82 extending from the lower face of the dielectric part 70 toward the upper face. The joint part 83 does not necessarily extend in the negative direction of the x-axis as illustrated in FIGS. 4A to 4F, but may extend in the positive direction of the x-axis. Further, the metal shield plate 80 may include both the joint part 83 that extends in the negative direction of the x-axis and the joint part 83 that extends in the positive direction of the x-axis.

[4. Effects Etc.]

As described above, a radio-frequency module 1A according to the embodiment includes: a module substrate 91; a first circuit component and a second circuit component that are disposed inside the module substrate 91; and a metal shield plate 80 set to a ground potential. The module substrate 91 includes a dielectric part 71 including a first dielectric material, and a dielectric part 70 including a second dielectric material and located inward of the dielectric part 71, the second dielectric material having a relative permittivity different from a relative permittivity of the first dielectric material. The metal shield plate 80 is disposed between the first circuit component and the second circuit component and in the dielectric part 70.

According to the above-mentioned configuration, the step of placing the metal shield plate 80 in the dielectric part 70, and the step of forming the module substrate 91 including the dielectric part 71 can be made separate. This allows for easy placement of the metal shield plate 80 inside the module substrate 91. As described above, the metal shield plate 80 is disposed between the first circuit component and the second circuit component that are disposed inside the module substrate 91. This helps to reduce electromagnetic coupling between the first circuit component and the second circuit component. This results in the ability to reduce strong signal interference inside the module substrate 91 between transmit signals, between a transmit signal and a receive signal, and between receive signals. This in turn helps to reduce deterioration in the quality of a transmit signal and a receive signal.

The radio-frequency module 1A may be configured such that the relative permittivity of the second dielectric material is lower than the relative permittivity of the first dielectric material.

According to the above-mentioned configuration, interference between radio-frequency signals in the dielectric part 70 can be reduced in comparison to interference between radio-frequency signals in the dielectric part 71.

The radio-frequency module 1A may be configured such that the dielectric part 70 is a cavity.

The above-mentioned configuration helps to minimize interference between radio-frequency signals in the dielectric part 70, and also simplify the step of forming the dielectric part 70.

The radio-frequency module 1A may be configured such that at least one of the first circuit component and the second circuit component is a surface-mount electronic component or a surface-mount semiconductor IC.

According to the above-mentioned configuration, an electronic component with a high Q-factor, or a high-performance semiconductor IC is disposed inside the module substrate. This enables miniaturization while allowing for improved radio-frequency performance of the radio-frequency module 1A.

The radio-frequency module 1A may be configured such that the first circuit component and the second circuit component are disposed in the dielectric part 70.

According to the above-mentioned configuration, the step of placing the first circuit component, the second circuit component, and the metal shield plate 80 in the dielectric part 70, and the step of forming the module substrate 91 can be made separate. This therefore allows a surface-mount electronic component and a surface-mount semiconductor IC to be easily placed inside the module substrate 91 together with the metal shield plate 80.

The radio-frequency module 1A may be configured such that: the radio-frequency module 1A further includes a power amplifier 10, and a low-noise amplifier 20; the first circuit component is a first inductor connected with an output terminal of the power amplifier 10; and the second circuit component is a second inductor connected with an input terminal of the low-noise amplifier 20.

According to the above-mentioned configuration, the presence of the metal shield plate 80 allows for reduced electromagnetic coupling between a transmit signal to be transferred through the first inductor, and a receive signal to be transferred through the second inductor. This therefore helps to reduce strong signal interference between a transmit signal and a receive signal inside the module substrate 91, and consequently reduce deterioration of reception sensitivity.

The radio-frequency module 1A may be configured such that: the radio-frequency module 1A further includes a power amplifier 10; the first circuit component is a first inductor connected with an output terminal of the power amplifier 10; the second circuit component is a low-noise amplifier 20; the low-noise amplifier 20 is included in a semiconductor IC 60; and the metal shield plate 80 is disposed between the first inductor and the semiconductor IC 60.

According to the above-mentioned configuration, the presence of the metal shield plate 80 allows for reduced electromagnetic coupling between a transmit signal to be transferred through the first inductor, and a receive signal to be transferred through the low-noise amplifier 20. This therefore helps to reduce strong signal interference between a transmit signal and a receive signal inside the module substrate 91, and consequently reduce deterioration of reception sensitivity.

The radio-frequency module 1A may be configured such that: the first circuit component is disposed in a path, the path being one of a transmit path, a receive path, and a transmit and receive path, the transmit path being a path to transfer a transmit signal, the receive path being a path to transfer a receive signal, the transmit and receive path being a path to transfer a transmit signal and a receive signal; and the second circuit component is disposed in a path, the path being one of the transmit path, the receive path, and the transmit and receive path excluding the path in which the first circuit component is disposed.

The above-mentioned configuration helps to reduce strong signal interference between a transmit signal and a receive signal inside the module substrate 91. This consequently helps to reduce deterioration in the quality of a transmit signal, and deterioration of reception sensitivity.

The radio-frequency module 1A may be configured such that the metal shield plate 80 includes a body part 81 extending in a direction perpendicular to a major face 91*a* of the module substrate 91, and a joint part 83 extending in parallel to the major face 91*a*.

According to the above-mentioned configuration, the metal shield plate 80 and the via-conductor 96 are joined with each other by the joint part 83. This improves the accuracy of placement of the metal shield plate 80, and the strength of the joining between the metal shield plate 80 and the via-conductor 96.

The radio-frequency module 1A may be configured such that: the metal shield plate 80 includes a body part 81 extending in a direction perpendicular to a major face 91*a* of the module substrate 91, and a body end portion 87 having a flat shape and disposed at an end portion of the body part 81, the end portion being an end portion located in a direction parallel to the major face 91*a*; and the body part 81 and the body end portion 87 are non-parallel to each other.

According to the above-mentioned configuration, the body part 81 and the body end portion 87 are non-parallel to each other. This helps to ensure that the metal shield plate 80 be self-standing. The absence of the joint part 83 helps to reduce the space required for the placement of the metal shield plate 80.

The radio-frequency module 1A may be configured such that a hole 82 is provided between an end portion of the metal shield plate 80, and the dielectric part 71, the hole 82 penetrating the metal shield plate 80 in a direction of a normal to the metal shield plate 80.

The above-mentioned configuration helps to ensure, in forming the dielectric part 70, good flowability of the second dielectric material in liquid form in the vicinity of the metal shield plate 80. This therefore helps to reduce occurrence, in the vicinity of the metal shield plate 80, of voids or other areas where no second dielectric material is present.

A communication apparatus 5 includes: an RFIC 3 that processes a radio-frequency signal transmitted and received by an antenna 2; and the radio-frequency module 1 that transfers the radio-frequency signal between the antenna 2 and the RFIC 3.

The above-mentioned configuration makes it possible to provide the communication apparatus 5 with reduced deterioration in the quality of a transmit signal or a receive signal.

Other Embodiments, Etc.

Although the radio-frequency module and the communication apparatus according to the present disclosure have been described above by way of an embodiment, an inventive example, and a modification, the radio-frequency module and the communication apparatus according to the present disclosure are not limited to the embodiment, the inventive example, and the modification described above. The present disclosure is intended to encompass other embodiments implemented by combining any components in the embodiment, the inventive example, and the modification mentioned above, modifications obtained by modifying the embodiment, the inventive example, and the modification mentioned above in various ways as may become apparent to one skilled in the art without departing from the scope of the present disclosure, and various kinds of equipment incorporating the radio-frequency module and the communication apparatus.

For example, in the radio-frequency module 1A according to the inventive example, the constituent circuit components of the radio-frequency module 1A are disposed over one major face 91a of the module substrate 91. Alternatively, the circuit components may be disposed over the opposite major faces 91a and 91b of the module substrate 91 in a distributed fashion. That is, the constituent circuit components of the radio-frequency module 1A may be mounted over one side of the module substrate, or may be mounted over both sides of the module substrate.

For example, in the radio-frequency module and the communication apparatus according to the embodiment, the inventive example, and the modification mentioned above, other circuit elements, wiring, and other features may be inserted between paths that connect the circuit elements and the signal paths that are illustrated in the drawings.

INDUSTRIAL APPLICABILITY

The present disclosure is applicable to a wide variety of communication apparatuses such as mobile phones, as a radio-frequency module disposed in a multiband-compatible front-end part of such communication apparatuses.

REFERENCE SIGNS LIST 1, 1A radio-frequency module
2 antenna
3 radio-frequency integrated circuit (RFIC)
4 baseband integrated circuit (BBIC)
5 communication apparatus
10 power amplifier
20 low-noise amplifier
30, 35 duplexer
31, 33 transmit filter
32, 34 receive filter
40, 41, 42 switch
40a, 41a, 42a common terminal
40b, 40c, 41b, 41c, 42b, 42c selection terminal
51, 52 matching circuit
60 semiconductor IC
70, 71 dielectric part
80, 80A, 80B, 80C, 80D, 80E, 80F metal shield plate
81 body part
82 hole
83 joint part
87 body end portion
91 module substrate
91a, 91b major face
92 resin component
95 metal shield layer
96 via-conductor
97 ground electrode
100 antenna connection terminal
110 transmit input terminal
120 receive output terminal
150 external connection terminal
150g ground terminal
AR, BR receive path
AT, BT transmit path
CTR transmit and receive path

The invention claimed is:

1. A radio-frequency module comprising:
a module substrate;
a first circuit component and a second circuit component inside the module substrate; and
a metal shield plate set to a ground potential,
wherein the module substrate comprises:
a first dielectric part comprising a first dielectric material, and
a second dielectric part comprising a second dielectric material and located inward of the first dielectric part, the second dielectric material having a first relative permittivity that is different from a second relative permittivity of the first dielectric material, and
wherein the metal shield plate is between the first circuit component and the second circuit component and in the second dielectric part.

2. The radio-frequency module according to claim 1, wherein the first relative permittivity of the second dielectric material is lower than the second relative permittivity of the first dielectric material.

3. The radio-frequency module according to claim 2, wherein the second dielectric part comprises a cavity.

4. The radio-frequency module according to claim 1, wherein at least one of the first circuit component and the second circuit component comprises a surface-mount electronic component or a surface-mount semiconductor integrated circuit (IC).

5. The radio-frequency module according to claim 1, wherein the first circuit component and the second circuit component are in the second dielectric part.

6. The radio-frequency module according to claim 1, further comprising:
a power amplifier; and
a low-noise amplifier, wherein the first circuit component comprises a first inductor connected with an output terminal of the power amplifier, and
wherein the second circuit component comprises a second inductor connected with an input terminal of the low-noise amplifier.

7. The radio-frequency module according to claim 1, further comprising:
a power amplifier,
wherein the first circuit component comprises a first inductor connected with an output terminal of the power amplifier,
wherein the second circuit component comprises a low-noise amplifier,
wherein the low-noise amplifier is included in a first semiconductor integrated circuit (IC), and
wherein the metal shield plate is between the first inductor and the first semiconductor IC.

8. The radio-frequency module according to claim 1,
wherein the first circuit component is in a first path, the first path being one of a transmit path, a receive path, and a transmit and receive path, the transmit path being a path to transfer a transmit signal, the receive path being a path to transfer a receive signal, the transmit and receive path being a path to transfer a transmit signal and a receive signal, and
wherein the second circuit component is in a second path, the second path being one of the transmit path, the receive path, and the transmit and receive path excluding the first path in which the first circuit component is in.

9. The radio-frequency module according to claim 1,
wherein the metal shield plate comprises:
a body part extending in a direction perpendicular to a major face of the module substrate, and
a joint part extending in parallel to the major face.

10. The radio-frequency module according to claim 1,
wherein the metal shield plate comprises:
a body part extending in a direction perpendicular to a major face of the module substrate, and
a body end portion comprising a flat shape and at an end portion of the body part, the end portion being an end portion located in a direction parallel to the major face, and
wherein the body part and the body end portion are non-parallel to each other.

11. The radio-frequency module according to claim 1,
wherein a hole is between an end portion of the metal shield plate, and the first dielectric part, the hole penetrating the metal shield plate in a normal direction relative to the metal shield plate.

12. A communication apparatus comprising:
a radio-frequency integrated circuit that is configured to process a radio-frequency signal transmitted and received by an antenna; and
the radio-frequency module claim 1 that is configured to propagate the radio-frequency signal between the antenna and the radio-frequency integrated circuit.

13. The radio-frequency module according to claim 2,
wherein at least one of the first circuit component and the second circuit component comprises a surface-mount electronic component or a surface-mount semiconductor integrated circuit (IC).

14. The radio-frequency module according to claim 3,
wherein at least one of the first circuit component and the second circuit component comprises a surface-mount electronic component or a surface-mount semiconductor integrated circuit (IC).

15. The radio-frequency module according to claim 2,
wherein the first circuit component and the second circuit component are in the second dielectric part.

16. The radio-frequency module according to claim 3,
wherein the first circuit component and the second circuit component are in the second dielectric part.

17. The radio-frequency module according to claim 4,
wherein the first circuit component and the second circuit component are in the second dielectric part.

18. The radio-frequency module according to claim 2, further comprising:
a power amplifier; and
a low-noise amplifier,
wherein the first circuit component comprises a first inductor connected with an output terminal of the power amplifier, and
wherein the second circuit component comprises a second inductor connected with an input terminal of the low-noise amplifier.

19. The radio-frequency module according to claim 3, further comprising:
a power amplifier; and
a low-noise amplifier,
wherein the first circuit component comprises a first inductor connected with an output terminal of the power amplifier, and
wherein the second circuit component comprises a second inductor connected with an input terminal of the low-noise amplifier.

20. The radio-frequency module according to claim 4, further comprising:
a power amplifier; and
a low-noise amplifier,
wherein the first circuit component comprises a first inductor connected with an output terminal of the power amplifier, and
wherein the second circuit component comprises a second inductor connected with an input terminal of the low-noise amplifier.

* * * * *